US006776170B2

(12) United States Patent
Liu

(10) Patent No.: US 6,776,170 B2
(45) Date of Patent: Aug. 17, 2004

(54) METHOD AND APPARATUS FOR PLASMA CLEANING OF WORKPIECES

(75) Inventor: Lianjun Liu, Gilbert, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/279,928

(22) Filed: Oct. 25, 2002

(65) Prior Publication Data

US 2003/0047191 A1 Mar. 13, 2003

Related U.S. Application Data

(63) Continuation of application No. PCT/US01/13002, filed on Apr. 23, 2001.
(60) Provisional application No. 60/199,354, filed on Apr. 25, 2000.

(51) Int. Cl.[7] .............................. B08B 6/00; B44C 1/22
(52) U.S. Cl. ............................ 134/1.1; 134/1.2; 216/67
(58) Field of Search ..................... 134/1.1, 1.2; 216/67; 438/712

(56) References Cited

U.S. PATENT DOCUMENTS

| 4,662,977 A | * | 5/1987 | Motley et al. ......... 156/345.49 |
| 5,882,538 A | * | 3/1999 | Martin et al. .................. 216/71 |
| 5,900,288 A | * | 5/1999 | Kuhman et al. ............ 427/534 |
| 5,915,204 A | | 6/1999 | Sumi |
| 6,107,192 A | * | 8/2000 | Subrahmanyan et al. ... 438/637 |

FOREIGN PATENT DOCUMENTS

| JP | 2000-082681 | 3/2000 |
| JP | 2000-150479 | 5/2000 |
| WO | WO 99/34424 | 7/1999 |

OTHER PUBLICATIONS

Aoki et al., "In situ substrate cleaning by low–energy ion bombardment for high quality thin film formation," J. Vac. Sci. Technol.A 11(2), Mar./Apr. 1993, pp. 307–313.

Grotjohn, "Ion sources for microfabrication (invited)" Rev. Sci. Instrum. 65 (4), Apr. 1994, pp. 1298–1303.

* cited by examiner

Primary Examiner—Frankie L. Stinson
Assistant Examiner—Saeed Chaudhry
(74) Attorney, Agent, or Firm—Pillsbury Winthrop LLP

(57) ABSTRACT

A method and apparatus for plasma cleaning a workpiece (W) in a plasma-cleaning chamber (20) having an interior region (30). The method comprises the steps of first, loading the workpiece into the plasma cleaning chamber interior region. The next step is pumping down the plasma cleaning chamber interior region down to a pre-determined pressure, with hydrogen as the ambient gas. The next step is forming from the hydrogen gas a plasma (36) having an ion density in the range between $10^{10}$ and $10^{13}$ cm$^{-3}$ and an ion energy lower than 30 eV The last step is exposing the workpiece to the plasma for a predetermined time. The apparatus of the present invention preferably includes first and second vacuum processing chambers (20 and 120), wherein the first chamber performs the plasma cleaning of the workpiece according to the method of the invention, and the second chamber performs an additional process step, e.g., depositing a metal.

14 Claims, 2 Drawing Sheets

METHOD AND APPARATUS FOR PLASMA CLEANING OF WORKPIECES

This is a continuation of International Application No. PCT/US01/13002, which was filed on Apr. 23, 2001, and also claims benefit of U.S. application Ser. No. 60/199,354, which was filed Apr. 25, 2000, the contents of both of which are incorporated herein in their entirety.

BACKGROUND OF THE INVENTION

The present invention relates to the preparation of workpieces, and in particular relates to the cleaning of workpiece surfaces using a hydrogen-based plasma.

A fundamental step in the manufacturing of semiconductor devices, such as integrated circuits (ICs), is the process of forming electrical interconnections, or "contacts." The formation of a low resistance contact involves the steps of providing a semiconductor workpiece, such as a silicon wafer, cleaning the surface of the workpiece, selectively depositing a metal, such as titanium, on the surface, and thermally annealing the metal. Where the metal is titanium, the annealing process causes the formation of titanium silicide, which consumes some of the underlying silicon.

Unfortunately, as minimum circuit dimensions decrease, the use of metals for forming the electrical contacts becomes problematic. This is primarily because the resistivity of the metal-silicon (e.g., titanium silicide) contact increases dramatically when the size of contact (i.e., the "line width") is one micron or less. Compounding the problem, as line widths diminish below one micron, device junction depths decrease to just a few hundred angstroms. Since the formation of silicides consumes some of the underlying silicon, a reduction in the junction depth to a few hundred angstroms means that the integrity of the junction is at risk.

Use of the metal cobalt has been proposed as a solution to the above-described problems associated with titanium-based contacts, and is used in sub 0.25 micron manufacturing processes. However, the use of cobalt in forming contacts introduces additional problems. For example, cobalt does not react with silicon oxides or any of the other likely surface contaminants, such as water and C-F polymers. Consequently, the surface of the wafer prior to cobalt deposition must be far cleaner than what is necessary for other metal-silicon contacts, such as titanium silicide.

There are two techniques currently used in semiconductor manufacturing to clean workpiece surfaces prior to forming contacts using cobalt. One method is to clean the wafer in a variety of chemical solutions, including a final step of cleaning the wafer with a hydrofluoric (HF) dip. Though this approach is effective for many cleaning processes (especially those involving 0.5 micron technology and higher), HF is not as sufficiently reliable for sub 0.25 micron technology. Furthermore, this chemical poses significant health risks to operators and technicians. Moreover, workpieces to be processed must be transported from the HF dip tank to the deposition reactor. In this transportation step the workpieces are exposed to air, which oxidizes the exposed surface, thereby degrading device performance and reducing process tolerances.

The second workpiece cleaning surface method used prior to cobalt deposition involves sputtering the workpiece surface with argon ions. To be effective, the energy of the ions must be reasonably high. Unfortunately, use of such high-energy ions is problematic. For example, sputtering at such high energies can result in argon being incorporated into the silicon. Such ions can result in the generation of crystal defects as deep as several hundred angstroms. Other problems include erosion of the silicon itself, re-deposition of the sputtered materials, and the penetration of surface contaminants into the silicon.

The use of hydrogen plasma has been proposed as a method for cleaning surfaces. Since the chemical byproducts of hydrogen plasma are essentially gaseous, the cleaning process should be very effective. However, when the use of hydrogen plasma to clean wafers was studied, numerous problems emerged. For example, when using a parallel plate reactive ion etch (RIE) system, severe silicon erosion and the diffusion of hydrogen into the silicon resulted from the high ion energy generated in the source plasma. When a microwave-excited downstream plasma was used, the removal rate of the native oxide and other contaminants was significantly reduced due to the low energy of the hydrogen radicals and the reduction of radical concentration during the transportation from the source to the wafer surface.

BRIEF SUMMARY OF THE INVENTION

The present invention relates to the preparation of workpieces, and in particular relates to the cleaning of workpiece surfaces using a hydrogen-based plasma.

A first aspect of the invention is a method of plasma cleaning a workpiece in a plasma-cleaning chamber having an interior region. The method comprises the steps of first, loading the workpiece into the plasma cleaning chamber interior region. The next step is pumping the plasma cleaning chamber interior region down to a pre-determined pressure, with hydrogen as the ambient gas. The next step is forming from the hydrogen gas a plasma having an ion density in the range of $10^{10}$ to $10^{13}$ $cm^{-3}$ and preferably greater than $10^{12}$ $cm^{-3}$, and an ion energy lower than 30 eV and preferably in the range from 10 to 15 eV. The last step is exposing the workpiece to the plasma for a predetermined time.

A second aspect of the invention is the method as described above, further including the steps, after the wafer is cleaned, of transferring the workpiece from the plasma cleaning chamber to a processing chamber, and then performing a process step to the workpiece. This process step may be, for example, depositing a metal.

A third aspect of the invention is an integrated workpiece processing apparatus for plasma cleaning a workpiece and then processing the workpiece. The apparatus comprises a first vacuum processing chamber adapted to plasma clean a workpiece with a plasma having a high ion density, low ion energy and low plasma potential. The first vacuum processing chamber includes a workpiece support fitted therein. The apparatus also includes a second vacuum processing chamber adapted to perform a process selected from the group consisting of CVD, PVD, sputtering, and etching of a workpiece. The second processing chamber is also fitted with a workpiece support. Further included in the apparatus is a vacuum transfer chamber connecting the first and second chambers. The transfer chamber is sized so that a workpiece may pass between the chambers. The purpose of the transfer chamber is to prevent the workpiece from being exposed to contaminants (i.e., oxygen or water vapor, etc.) after it has been cleaned in the first vacuum processing chamber.

DETAILED DESCRIPTION OF THE INVENTION

The present invention relates to the preparation of workpieces, and in particular relates to the cleaning of workpiece surfaces using a hydrogen-based plasma. The present invention is particularly useful in preparing a workpiece in which low-resistivity metal silicide contacts are to be formed in the process of fabricating semiconductor devices in a silicon workpiece (wafer).

Figure 1:
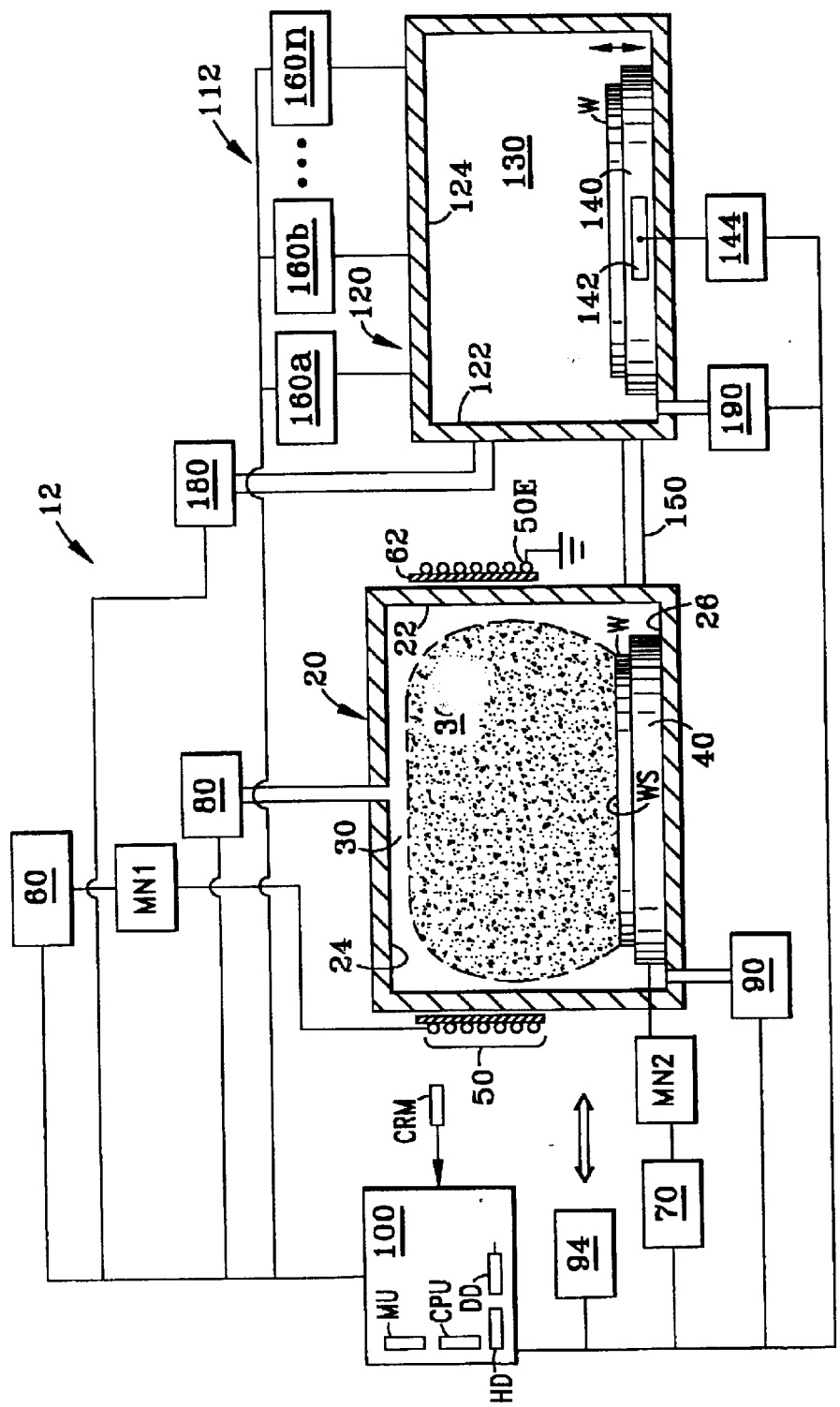
FIG. 1 is a schematic diagram of the plasma-cleaning system of the present invention, shown as used in combination with a process chamber used to process the workpiece after it is cleaned in the plasma-cleaning chamber.

With reference now to FIG. 1, there is shown a plasma-cleaning system 12 in the form of an ESRF plasma reactor (though other reactors, such as a neutral-loop plasma (NLP) reactor, an ultra-high frequency (UHF) plasma reactor, and the like could also be used). System 12 comprises a plasma-cleaning chamber 20 as a vacuum processing chamber adapted to perform plasma cleaning of a workpiece W, such as a silicon wafer. Workpiece W has an upper surface WS. Chamber 20 has sidewalls 22, an upper wall 24 and a lower wall 26 that enclose an interior region 30 capable of supporting a hydrogen plasma 36. The latter has a high ion density and low ion energy, arising from a low voltage (potential). These plasma properties minimize ion penetration into workpiece surface WS and are a key aspect of the present invention. Chamber 20 includes within region 30 a workpiece support 40 arranged adjacent lower wall 26 for supporting workpiece W while the workpiece is processed in chamber 20. The workpiece support 40 preferably includes a lifting member (not shown) for vertical translation in order to position workpiece support 40 for workpiece exchange as well as position the workpiece at an optimal position relative to the plasma for process. The optimal position may be one that achieves an acceptable rate for the cleaning process and spatial uniformity of the cleaning process.

Figure 2:
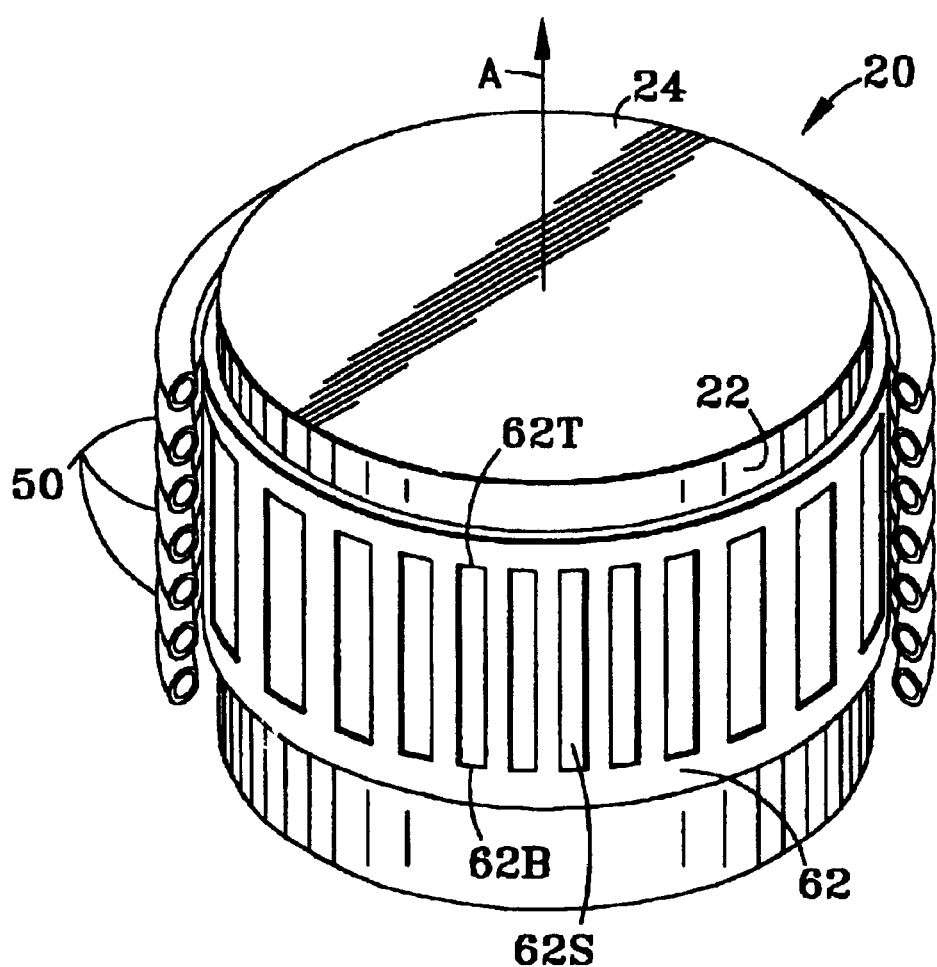
FIG. 2 is a close-up perspective view of the plasma-cleaning chamber of the system shown in FIG. 1.

With reference to FIG. 2, in a preferred embodiment, chamber 20 of plasma-cleaning system 12 includes an inductive coil 50 wrapped around chamber sidewalls 22 so as to surround interior region 30. Inductive coil 50 may be a helical resonator (i.e. a quarter-wave or half-wave resonator), wherein one coil end 50E (shown in FIG. 1) is grounded, and the opposite coil end is open. Coil 50 is electrically connected to a chamber RF power supply 60 through a match network MN1. For a helical resonator, match network MN1 will be connected to a tap location generally near grounded end 50E. The latter is used to maximize RF power transfer to plasma 36.

Between inductive coil 50 and chamber walls 22 is a grounded electrostatic shield 62 (also referred to as an E-shield or Faraday shield) comprising an electrically grounded, conductive sheet with slots 62S each having a bottom 62B and a top 62T. Slots 62S are aligned parallel with the axis of revolution A of chamber 20 and are typically equally spaced. Slots 62S may have a width, for example, of between 2 mm–6 mm. The total area covered by all slots 62S should preferably fall into the range of 0.2 to 5% of the total area of shield 62. E-shield 62 minimizes capacitive coupling between coils 50 and plasma 36 by limiting the area of slots 62S through which the electromagnetic field from the coils can couple to the plasma.

With reference again to FIG. 1, system 12 also includes a workpiece support RF power supply 70 electronically connected to workpiece support 40 through a match network MN2, to supply an electrical bias to the workpiece.

Plasma-cleaning system 12 further includes gas supply system 80 in pneumatic communication with plasma-cleaning chamber 20 via a gas conduit 82. Gas supply system 80 includes a source of hydrogen gas 86 used to create hydrogen plasma 36. Preferably only hydrogen gas is used for the cleaning process. However, other gases, in particular inert gases, may be used as a dilution gas. For example, helium may be used as a dilution gas. However, due to its high ionization energy, it can raise the "tail" of the electron energy distribution function, which can be a disadvantage to the process. Moreover, argon could be used as the dilution gas. However, due to its mass, it has the disadvantage of increasing the ion bombardment of the sensitive contact surface. Gas supply system 80 also regulates the flow of hydrogen gas to chamber interior region 30. Gas supply system 80 also connects appropriate gasses to a second processing chamber, as discussed below.

Plasma cleaning system 12 also includes a vacuum pump system 90 pneumatically connected to chamber 20 for evacuating interior region 30 to at least approximately 1–100 mTorr. Further included in plasma cleaning system 12 is a workpiece handling and robotic system 94 that transports workpieces W to and from workpiece support 40.

RF power supplies 60 and 70, gas supply system 80, vacuum pump system 90 and workpiece handling and robotic system 94 are all electronically connected to and controlled by a main control system 100.

In a preferred embodiment, main control system 100 is a computer having a memory unit MU having both random-access memory (RAM) and read-only memory (ROM), a central processing unit CPU (e.g., PENTIUM™ processor from Intel Corporation), and a hard disk HD, all electronically connected. Hard disk HD serves as a secondary computer-readable storage medium, and may be, for example, a hard disk drive for storing information corresponding to instructions for control system 184 to carry out the present invention, as described below. Control system 100 also preferably includes a disk drive DD, electronically connected to hard disk HD, memory unit MU and central processing unit CPU, wherein the disk drive is capable of accepting and reading (and even writing to) a computer-readable medium CRM, such as a floppy disk or compact disk (CD), on which is stored information corresponding to instructions for control system 100 to carry out the present invention. It is also preferable that main control system 100 have data acquisition and control capability. A preferred control system 100 is a computer, such as a DELL PRECISION WORKSTATION 610™, available from Dell Corporation, Dallas, Tex.

With continuing reference to FIG. 1, in a preferred embodiment of the present invention, plasma-cleaning system 12 is in operable communication with a workpiece processing system 112 for further processing workpiece W after it is cleaned in the plasma-cleaning system. Workpiece processing system 112 includes a process chamber 120 as a second vacuum processing chamber adapted to perform a desired process, such as chemical vapor deposition (CVD), physical vapor deposition (PVD), etching, or sputtering, on workpiece W. Chamber 120 has sidewalls 122, an upper wall 124 and a lower wall 126 that enclose an interior region 130. Chamber 120 includes within region 130 a workpiece support 140 arranged adjacent lower wall 126 for supporting workpiece W while the workpiece is processed. Workpiece support 140 includes a heater 142 and heater power supply 144 electrically connected to the heater. Workpiece support 140 is preferably adjustable so that workpiece W can be positioned in different locations within interior region 130.

Workpiece processing system 112 further includes a second gas supply system 180 pneumatically connected to process chamber 120 via gas conduit 182. Alternatively, a gas supply system 80 could also be used to supply gas to chamber 120. Also included is a vacuum pump system 190 pneumatically connected to chamber 120 and capable of producing a vacuum of at least approximately 1–100 mTorr. Alternatively, vacuum pump system 90 could also be connected to chamber 120 and used to control the pressure in interior region 30.

Heater power supply 144, gas supply system 180, and vacuum pump system 190 are also electronically connected to and controlled by control system 100.

In the present preferred embodiment, systems 12 and 112 are interconnected via a vacuum transfer (or "load lock") chamber 150 through respective chamber sidewalls 22 and 122. In this preferred embodiment, workpiece handling and robotics system 94 also transports workpiece W between chambers 20 and 120, and also removes the workpiece from workpiece support 140 after processing in chamber 120. This allows for transfer of workpiece W from chamber 20 to chamber 120 while in a contamination-free environment.

Also, control system 100 is shown in electronic communication with various systems 160a, 160b, . . . 160n which may be conventional individual power sources for individual segments of a segmented electrode (not shown).

In the above-described preferred embodiment, the combination of plasma-cleaning system 12 and workpiece processing system 112, along with the accompanying elements, constitute an integrated workpiece processing apparatus. All of the individual components and systems of systems 12 and 112 can be constituted by known, commercially available components And systems or can be constructed on the basis of knowledge already possessed by those skilled in the art.

Method of Operation

With continuing reference to FIG. 1, control system 100 causes workpiece handling and robotics system 94 to load a workpiece onto workpiece support 40 in plasma-cleaning chamber 20. Control system 100 then sends an electronic signal to vacuum system 90 to evacuate interior region 30 of plasma-cleaning chamber 20. Subsequently, control system 100 signals gas supply system 80 to introduce a controlled flow of a gas composed solely or predominantly of hydrogen, into interior region 30 of chamber 20 while sustaining the desired pressure inside the chamber. When chamber interior region 30 reaches a desired pressure, control system 100 signals RF power supply 60 to energize the gas to form plasma 36 in interior region 30.

Preferably the gas used for the cleaning process is composed only of hydrogen. However, other gases, in particular inert gases, may be used as dilution gas, provided that the gas composition does not introduce any unwanted chemical species in the cleaning process. For example, helium may be used as a dilution gas, although, due to its high ionization energy, it can raise the "tail" of the electron energy distribution function and this can be a disadvantage to the process. Moreover, argon could be used as the dilution gas, although, due to its mass, it has the disadvantage of increasing the ion bombardment of the sensitive contact surface.

As mentioned above, plasma 36 is formed so as to have a high ion density (e.g., from $10^{10}$ to $10^{13}$ ion/cm$^3$, preferably of order $10^{12}$ ion/cm$^3$), and low ion energy (e.g., less than 30 eV, preferably of order of 10 to 15 eV depending upon the RF bias power). This type of plasma has been found by the present inventors to be well-suited for cleaning substrates that have significant topography e.g., contacts, of contaminants such as oxides, organic residues, etching polymers, heavy metal atoms and water molecules, etc.

In particular, plasma 36 cleans workpiece W in the manner described as follows. As mentioned above, a key aspect of the present invention is the low plasma potential resulting from the use of E-shield 62. This means that if no bias is applied to workpiece W from workpiece RF power supply 70, the energy of the ions and the electrons in plasma 36 reaching the workpiece will be very low. Thus, in the case of no external applied bias from workpiece RF power supply 70, there is significantly reduced ionic bombardment of workpiece surface WS. Adjusting the bias applied to workpiece support 40 increases the kinetic energy of ions arriving at substrate surface WS. In addition, varying the amount of RF power from RF power supply 60 alters the ion density in plasma 36, while maintaining the energy of the ions at substantially the same level (typically on the order of 5 to 30 eV depending upon the RF bias power). This allows for control over the anisotropic etch characteristics of plasma 36. Thus, plasma 36 can be adjusted to have the right balance of "etching strength" (i.e., ion energy)—enough to clean workpiece surface WS without significantly etching into the surface—combined with the proper directionality (i.e., anisotropic etch, in a direction perpendicular to the workpiece surface).

The chemical and mechanical processes involved in the removal of contaminant material from the sensitive surfaces at the bottom of high aspect ratio contacts formed in workpiece W can be categorized as a plasma enhanced etch. In a preferred embodiment of the present invention, a hydrogen chemistry is employed to volatize a thin layer of contaminants subject to a shower of $H^+$ and $H_2^+$ ions. The primary independent process parameters available for adjusting the process include the gas specie(s), gas flow rate, chamber gas pressure, RF source power, and RF bias power (or workpiece holder peak-to-peak voltage). The above independent process parameters are then adjusted to provide an ion density and ion energy in the ranges provided above, wherein they are fine tuned to optimize the process. A preferred range of operating parameters for the cleaning process are 10 to 1000 sccm of hydrogen gas, preferably about 200 sccm, 1 to 500 mTorr chamber pressure, preferably 10 to 100 mTorr, 1 to 5 kW RF source power, preferably 3 kW at 50 mTorr, and 0 to 20 Volts (peak-to-peak RF bias on the workpiece holder (or chuck). Typically, the RF frequency for both the inductive coil and the chuck bias would be, for example, 13.56 MHz.

Upon terminating the cleaning process, control system 100 sends an electronic signal to wafer handling and robotics system 94, which then acts in response to the signal to remove move workpiece W from workpiece support 40. At this point, workpiece W can be transported through vacuum transportation chamber 150 to wafer support 140 in processing chamber 120 via wafer handling and robotics system 94. In a preferred embodiment of the present invention, workpiece W is a semiconductor wafer having a patterned surface (e.g., contact areas) that have been cleaned in plasma-cleaning chamber 20. Further, processing chamber 120 is preferably capable of depositing a metal layer to form low-resistance metal-silicide electrical connections (e.g., contacts) in the process of fabricating a semiconductor device. Any operation to be performed in process chamber 112 will be performed in a manner already known to those skilled in the art.

Although the above-described plasma-cleaning system 12 has been described in connection with an ESRF plasma reactor, it will be understood that alternate systems, including a neutral loop plasma (a Faraday shield in the form of a coil partially inside the reactor), or an ultra high frequency plasma, or an inductively coupled plasma (ICP) system capable of forming a high-density, low-potential plasma are also suitable for practicing the process of the present invention.

In fact, the many features and advantages of the present invention are apparent from the detailed specification and thus, it is intended by the appended claims to cover all such features and advantages of the described process which follow in the true spirit and scope of the invention. Further, since numerous modifications and changes will readily occur to those of ordinary skill in the art, it is not desired to limit the invention to the exact construction and operation illustrated and described. Moreover, the process and apparatus of the present invention, like related apparatus and processes used in the semiconductor arts tend to be complex in nature and are often best practiced by empirically determining the appropriate values of the operating parameters, or by conducting computer simulations to arrive at best design for a given application. Accordingly, all suitable modifications and equivalents should be considered as falling within the spirit and scope of the invention.

What is claimed is:

1. A method of plasma cleaning a workpiece in a plasma-cleaning chamber having an interior region comprising:

loading the workpiece into the chamber interior region;

pumping the chamber interior region down to a predetermined pressure with an ambient gas containing hydrogen;

forming from said ambient gas a plasma comprising ionic reactive species having an ion density in the range of $10^{10}$ to $10^{13}$ cm$^{-3}$, and an ion energy lower than 30 eV; and exposing the workpiece to said ionic reactive species for a predetermined sufficient to clean the workpiece.

2. A method according to claim 1, further including:

transferring the workpiece from the plasma-cleaning chamber to a processing chamber; and performing a process on the workpiece in the processing chamber.

3. A method according to claim 2, wherein said process includes depositing metal.

4. A method according to claim 1, wherein the ion density is greater than $10^{12}$ cm$^{-3}$ and the ion energy is between 10 eV and 15 eV in said forming.

5. A method according to claim 1, wherein said forming a plasma comprises supplying RF power in a range between 1 kW and 5 kW to the chamber interior region.

6. A method according to claim 5, wherein the amount of RF power supplied to the plasma is 3 kW and the predetermined pressure is 50 mTorr.

7. A method according to claim 1, further comprising causing hydrogen gas to flow into the chamber interior region at a rate of between 10 and 1000 sccm.

8. A method according to claim 1, wherein the predetermined pressure is in the range of 1 to 500 mTorr.

9. A method according to claim 1, wherein said loading comprises placing the workpiece on a workpiece holder, and said method further comprises applying an RF voltage having a peak-to-peak value not greater than 20V to the workpiece holder.

10. A method according to claim 1, wherein the ambient gas further contains at least one of helium and argon.

11. A method according to claim 1, wherein the ambient gas consists of hydrogen.

12. A method according to claim 2, wherein said transferring includes transporting the workpiece through a contamination-free environment.

13. A method according to claim 2, wherein said processing chamber is one of a sputtering chamber, a PVD chamber, a CVD chamber, and an etching chamber.

14. A method according to claim 1, wherein said plasma removes at least one material from the workpiece from the group of materials consisting of oxide, water, organic residue, etching polymers, and heavy metal atoms.

* * * * *

UNITED STATES PATENT AND TRADEMARK OFFICE
CERTIFICATE OF CORRECTION

PATENT NO. : 6,776,170 B2
DATED : August 17, 2004
INVENTOR(S) : Lianjun Liu

It is certified that error appears in the above-identified patent and that said Letters Patent is hereby corrected as shown below:

Column 7,
Lines 29-30, replace "exposing the workpiece to said ionic reactive species for a predetermined sufficient to clean the workpiece." with -- exposing the workpiece to said ionic reactive species for a predetermined time sufficient to clean the workpiece. --.

Signed and Sealed this

Fifteenth Day of February, 2005

JON W. DUDAS
*Director of the United States Patent and Trademark Office*